United States Patent [19]

Miyatake et al.

[11] Patent Number: 4,694,432
[45] Date of Patent: Sep. 15, 1987

[54] SEMICONDUCTOR MEMORY DEVICE

[75] Inventors: Hideshi Miyatake; Kazuyasu Fujishima; Kazuhiro Shimotori, all of Itami, Japan

[73] Assignee: Mitsubishi Denki Kabushiki Kaisha, Tokyo, Japan

[21] Appl. No.: 709,409

[22] Filed: Mar. 6, 1985

[30] Foreign Application Priority Data

Mar. 16, 1984 [JP] Japan .................................. 59-51861

[51] Int. Cl.$^4$ ............................................. G11C 13/00
[52] U.S. Cl. .................................... 365/203; 365/210; 307/441
[58] Field of Search ............... 365/203, 154, 189, 210; 307/441

[56] References Cited

PUBLICATIONS

"Laser Programmable Redundancy and Yield Improvement in a 64K DRAM", Robert T. Smith et al, IEEE Journal of Solid–State Circuits, vol. SC–16, No. 5, Oct. 1981.
"A Low–Power Sub 100 ns 256K Bit Dynamic RAM", Syuso Fujii et al, IEEE Journal of Solid–State Circuits, vol. SC–18, No. 5, Oct. 1983.
"A 256K Dynamic RAM with Page–Nibble Mode", Kazuyasu Fujishima et al, IEEE Journal of Solid–State Circuits, vol. SC–18, No. 5, Oct. 1983.

Primary Examiner—Terrell W. Fears
Attorney, Agent, or Firm—Lowe Price LeBlanc Becker & Shur

[57] ABSTRACT

A semiconductor memory device comprises a plurality of row decoder circuits connected with word lines for selecting memory cells. The row decoder circuits include normal row decoder circuits and spare row decoder circuits which can be selected in place of a normal row decoder circuit in case where a fault occurs in a memory cell selected by a word line connected to the normal row decoder circuit. An $\overline{RAS}$ signal (precharge signal) is applied to an output line (12) of a normal row decoder circuit through a precharge bus (31). A link element (11p) is inserted in the precharge bus (31). The link element (11p) is an element which can be melted by a laser beam, whereby the normal row decoder circuit associated is maintained in a non-selective state. A clamp circuit (14) is also connected to the output line (12). The clamp circuit (14) is a circuit for maintaining the output line (12) at a prescribed low level when the link element (11p) is melted and the associated decoder circuit is brought into a non-selective state.

6 Claims, 9 Drawing Figures

SEMICONDUCTOR MEMORY DEVICE

BACKGROUND OF THE INVENTION

1. Field of the Invention

The present invention relates to a semiconductor memory device in which an improvement is made in a decoder portion including spare decoders. Particularly, the present invention relates to a semiconductor memory device in which if a fault occurs in a memory cell connected to a normal decoder, the decoder connected with the faulty memory cell is separated to be in a non-selective state and a spare decoder in place thereof is brought into a selective state to be substituted for the above stated normal decoder, using a laser program system.

2. Description of the Prior Art

A semiconductor memory device, integrated to a high degree according to the recent trend, is generally provided with spare memory cells and spare decoders connected to the spare memory cells, so that even if a fault is caused in a part of memory cells in the manufacturing process thereof, the device as a whole can be protected from malfunctioning due to such fault. More specifically stated, such a semiconductor memory device is in a so-called redundancy structure in which if a fault is detected in a certain normal memory cell, a normal decoder connected therewith is separated to be in a non-selective state and a spare decoder is brought into a selective state in place of the normal decoder.

In a memory device of such a redundancy structure, a laser program system is often adopted as a method for operating a spare memory cell by separating the normal decoder concerned and bringing a spare decoder into a selective state in case where a fault is detected in a normal memory cell. In such a laser program system, a laser beam is applied to specified link elements, whereby the normal decoder associated is separated and a spare decoder is brought into a selective state.

For example, in "Laser Programmable Redundancy and Yield Improvement in a 64K DRAM" by R. T. Smith et al. in IEEE J. Solid-State Circuits, vol. SC-16, pp. 506–513, October 1981, a semiconductor memory device of a redundancy structure to which a laser program system is applicable is described. This document indicates, as factors constituting obstacles to accurate application of a laser beam to link elements, the following three points:

(1) effective spot diameter of a laser beam, (2) dimensions of link element and (3) distance between link elements, and points out problems caused in case of a high degree of integration of a memory device.

In "A Low-Power Sub 100ns 256K Bit Dynamic RAM" by S. Fujii et al. in IEEE J. Solid-State Circuits, vol. SC-18, pp. 441–445, October 1983, an example of a semiconductor memory device of a redundancy structure using a laser program system is disclosed. The device disclosed in this document does not comprise link elements for each word line so as to be adapted for a high degree of integration; however, this device involves demerits such as slow speed of operation.

In "A 256K Dynamic RAM with Page-Nibble Mode" by K. Fujishima et al. in IEEE J. Solid-State Circuits, vol. SC-18, pp. 470–478, October 1983, the prior art of most interest to the present invention is disclosed. For the purpose of clarifying the essential feature of the present invention, the art described in this document will be described concretely and briefly with reference to FIGS. 1 to 4.

Figure 1:
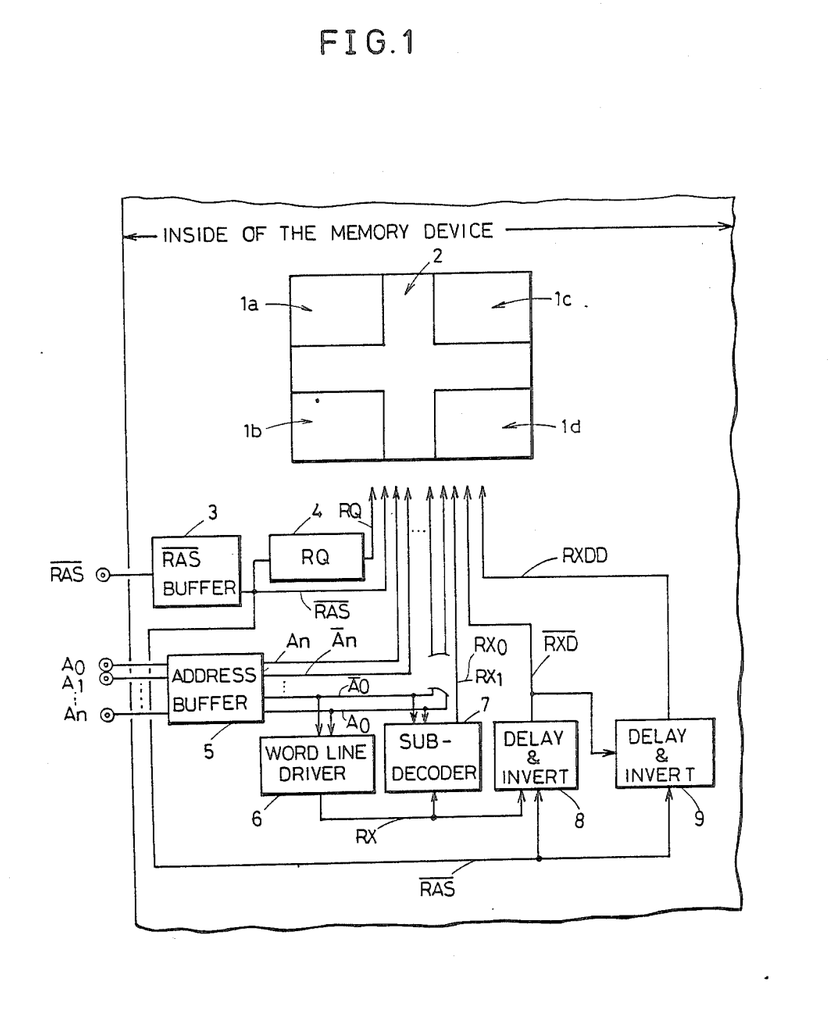
FIG. 1 is a plan view illustrating a typical structure of semiconductor memory device.

FIG. 1 is a plan view illustrating a typical structure of a semiconductor memory device.

Referring to FIG. 1, a semiconductor memory device comprises memory cell array portions $1a$, $1b$, $1c$ and $1d$ and a decoder portion 2 associated with the memory cell array portions $1a$ to $1d$. To the semiconductor memory device, an external reference signal $\overline{RAS}$ and external address signals $A_0$ to $A_n$ are applied from the outside. These signals are supplied to the decoder portion 2 through a specified circuit group.

The above stated specified circuit group is structured by, for example, an $\overline{RAS}$ buffer circuit 3 for providing an internal reference signal ($\overline{RAS}$ signal) based on an external reference signal $\overline{RAS}$, an RQ circuit 4 for providing a clamp signal (an RQ signal), an address buffer circuit 5 for address signals, a word line driver circuit 6, a sub-decoding circuit 7, a delay and inversion circuit 8 for providing an $\overline{RXD}$ signal and a delay and inversion circuit 9 for providing an RXDD signal. The signals supplied from the outside to the memory device are converted into signals suited for the decoder portion 2 by means of these circuits and base on the signals supplied from the outside, necessary signals are provided for the decoder portion 2.

Figure 2:
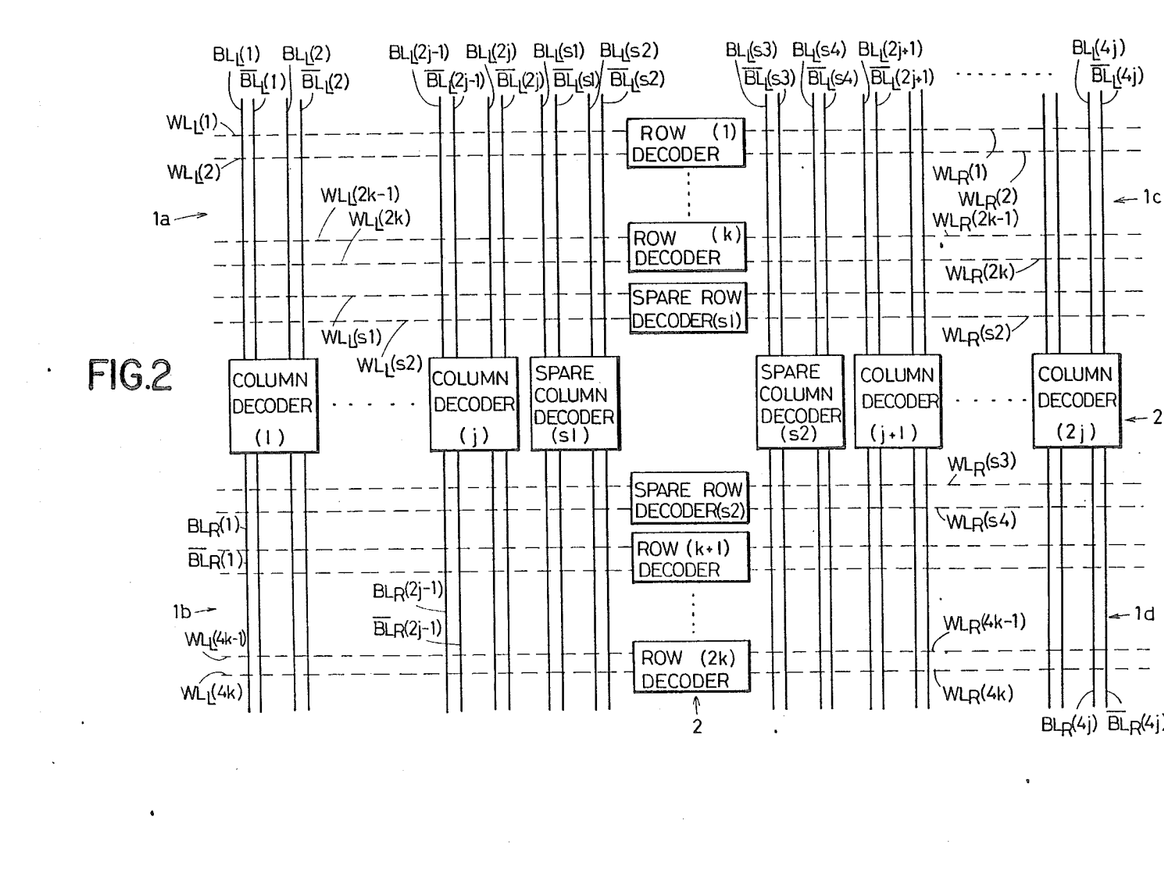
FIG. 2 is a detailed plan view illustrating array portions and decoder portions of a semiconductor memory device.

FIG. 2 is a detailed plan view illustrating the array portions $1a$ to $1d$ and the decoder portion 2. The array portions $1a$ to $1d$ include a plurality of word lines represented by the dotted lines extending horizontally and a plurality of bit lines represented by the solid lines extending vertically and intersecting orthogonally with the word lines. On the respective points of intersection between the word lines and the bit lines, memory cells not shown are disposed.

The decoder portion 2 includes a plurality of column decoders aligned horizontally and a plurality of row decoders aligned vertically. The column decoders include j normal column decoders (1) to (j) and a spare column decoder (S1) on the left in the drawing and a spare decoder (S2) and j normal column decoders (j+1) to (2j) on the right, j being an integer number. From the respective column decoders, two pairs of bit lines $BL_L$ (1), $\overline{BL}_L$ (1) and $BL_L$ (2), $\overline{BL}_L$ (2) to $BL_L$ (4j−1), $BL_L$ (4j−1) and $BL_L$ (4j), $\overline{BL}_L$ (4j) extend upward and two pairs of bit lines $BL_R$ (1), $\overline{BL}_R$ (1) and $BL_R$ (2), $\overline{BL}_R$ (2) to $BL_R$ (4j−1), $\overline{BL}_R$ (4j−1) and $BL_R$ (4j), $\overline{BL}_R$ (4j) extend downward in the drawing.

The row decoders aligned vertically include k normal decoders (1) to (k) and a spare decoder (S1) on the upper side and a spare decoder (S2) and k normal decoders (k+1) to (2k) on the lower side, k being an integer number. From the respective row decoders, two word lines $WL_L$ (1), $WL_L$ (2) to $WL_L$ (4k−1), $WL_L$ (4k) respectively extend to the left and two word lines $WL_R$ (1), $WL_R$ (2) to $WL_R$ (4k−1), $WL_R$ (4k) respectively extend to the right. These word lines intersect the bit lines as described previously. Memory cells are disposed on the respective intersection points so that four memory cell array portions $1a$ to $1d$ are formed.

Referring to FIG. 2, description will be made by taking the right, upper array portion $1c$ as an example. Now, assuming that a fault is detected in one of the memory cells disposed on the word line $WL_R$ (1) or $WL_R$ (2) extending from the row decoder (1), the memory cells selected by the normal row decoder (1) contain a faulty cell. Consequently, if the normal row decoder (1) is separated to be in a non-selective state and the spare row decoder (S1) is made to function in place, the semiconductor memory device as a whole functions normally. Such structure comprising spare decoders and memory cells associated with the spare decoders is generally called a redundancy structure or a redundancy circuit in a memory device.

In the following, a concrete circuit structure of a decoder will be described by taking an example of a row decoder.

Figure 3:
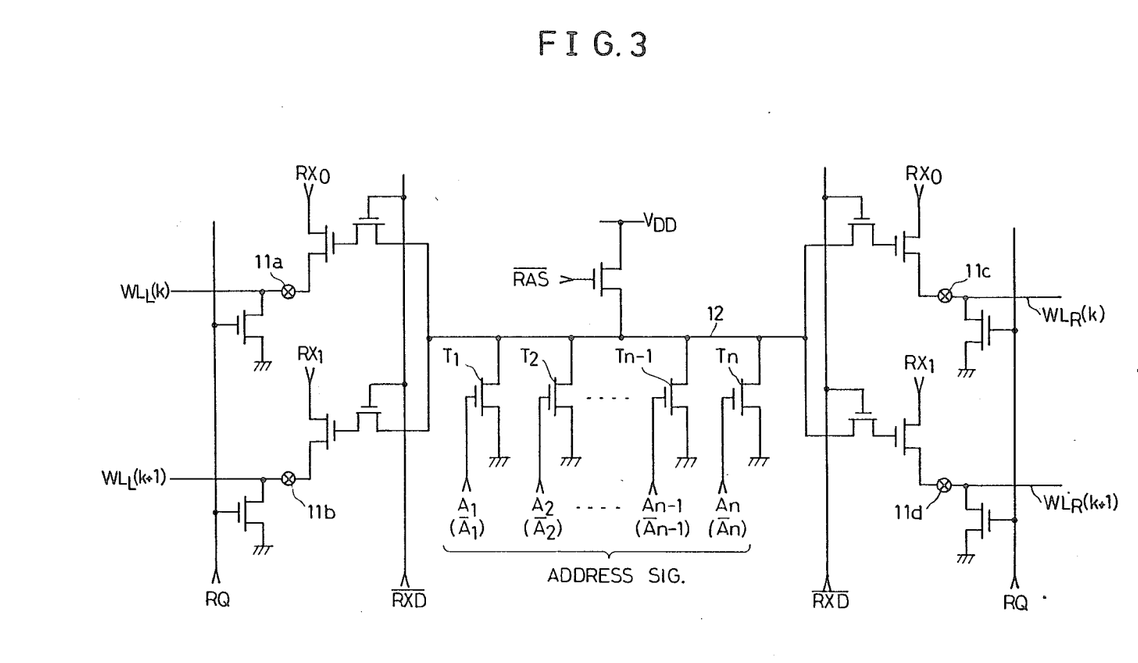
FIG. 3 is a circuit diagram of a conventional normal row decoder circuit for selecting a word line.

FIG. 3 is a circuit diagram of a normal row decoder for selecting word lines $WL_R(k)$, $WL_R(k+1)$, $WL_L(k)$ and $WL_L(k+1)$.

Referring to FIG. 3, a row decoder circuit is structured by a combination of MOS transistors, so that a word line is selected according to a signal applied thereto. The reference characters $11a$, $11b$, $11c$ and $11d$ denote link elements inserted in the respective word lines and by melting these link elements, an electrically discontinuous state is established. If a fault is found in a memory cell selected by and one of the word lines $WL_L(k)$, $WL_L(k+1)$, $WL_R(k)$ and $WL_R(k+1)$ connected respectively to the link elements $11a$ to $11d$, the link elements associated are melted by a laser beam and the word line selecting the faulty memory cell is made in a non-selective state. The reference character 12 denotes an output line of the row decoder circuit. Transistors $T_0$ to $T_n$ for discharge of the output line 12 are connected to the line 12.

Figure 4:
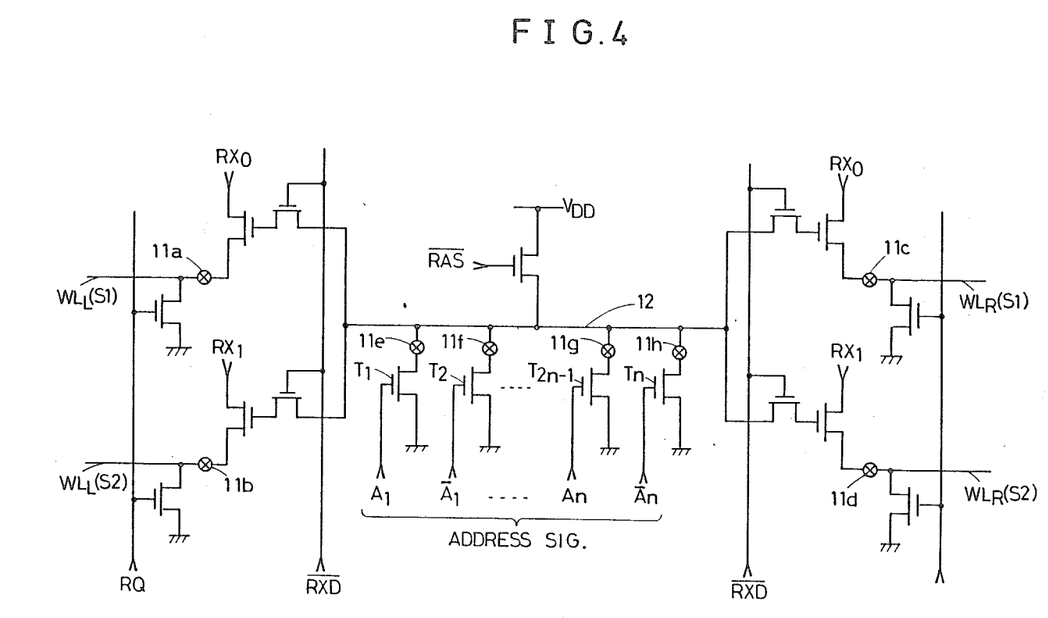
FIG. 4 is a circuit diagram of a conventional spare row decoder circuit.

FIG. 4 shows a spare row decoder circuit to be substituted for the normal row decoder in a non-selective state in association with a faulty memory cell.

Referring to FIG. 4, all the 2n address signals $A_1$, $\overline{A}_1$ to $A_n$, $\overline{A}_n$ are applied to the spare row decoder circuit, n being an integer number. The spare row decoder circuit is made in a non-selective state when it is not to be substituted for any one of the normal row decoder circuits. Substitution of the spare row decoder circuit for a normal row decoder circuit is made by selectively melting the n link elements $11e$ to $11h$ inserted in the input lines of the address signals in response to an address of a faulty memory cell. More specifically, in order to select an address signal $A_1$ or $\overline{A}_1$, $A_2$ or $\overline{A}_2$, . . ., $A_n$ or $\overline{A}_n$ according to the address of the faulty memory cell, the n link elements are selectively melted by a laser beam so that the same address signal as for the normal row decoder circuit in a non-selective state is applied to the spare row decoder circuit, whereby the substitution is made. The spare row decoder circuit includes link elements $11a$ to $11d$ in the junction points with the word lines in the same manner as in the normal row decoder circuit shown in FIG. 3. As a result, if a fault occurs in a memory cell associated with the spare row decoder circuit, the spare row decoder circuit itself can also be brought into a non-selective state.

However, in such a redundancy structure as described above, link elements $11a$ to $11d$ provided in a normal row decoder circuit for separating a word line associated with a faulty memory cell bringing it into a non-selective state are required for each word line. Accordingly, the distribution density of link elements becomes large and disadvantages are involved that the requirements for the positioning precision of a laser beam or the effective beam diameter at the time of melting link elements are too strict and sometimes it becomes practically impossible to melt link elements.

SUMMARY OF THE INVENTION

The present invention aims to overcome such disadvantages as described above and it is a primary object of the present invention to provide a semiconductor memory device of a redundancy structure suited for a high degree of integration, in which the requirements for the positioning precision of a laser beam and the effective beam diameter for melting link elements can be made less severe.

In order to attain the above described object, a redundancy structure is applied in accordance with the present invention, in which a link element is inserted in an input line for an $\overline{RAS}$ signal serving as a precharge signal of a normal decoder circuit and dependently on whether the link element is melted or not, the decoder circuit is made in a selective state or in a non-selective state.

In a preferred embodiment of the present invention, a clamp circuit is connected to an output line where precharge is applied by an $\overline{RAS}$ signal. Consequently, if the signal level in the output line of the decoder circuit in a non-selective state becomes high for one cause or another, the signal level is clamped to a prescribed level by the clamp circuit.

Therefore, according to the present invention, the distribution density of the link elements to be melted by a laser beam is decreased as compared with a conventional redundancy structure where link elements are provided for each word line or each bit line for selecting a memory cell. Accordingly, the requirements for the positioning precision of a laser beam or the effective beam diameter for melting link elements can be made less severe and a redundancy structure of a laser program system is made applicable to a semiconductor memory device of a large scale integration. In a semiconductor memory device in accordance with the present invention, the operation speed originally desired is not decreased since only the structure of link elements is different from that of a conventional device.

In addition, since the distribution density of link elements is decreased, the link elements can be arranged easily.

These objects and other objects, feature, aspects and advantages of the present invention will become more apparent from the following detailed description of the present invention when taken in conjunction with the accompanying drawings.

DESCRIPTION OF THE PREFERRED EMBODIMENTS

Figure 5:
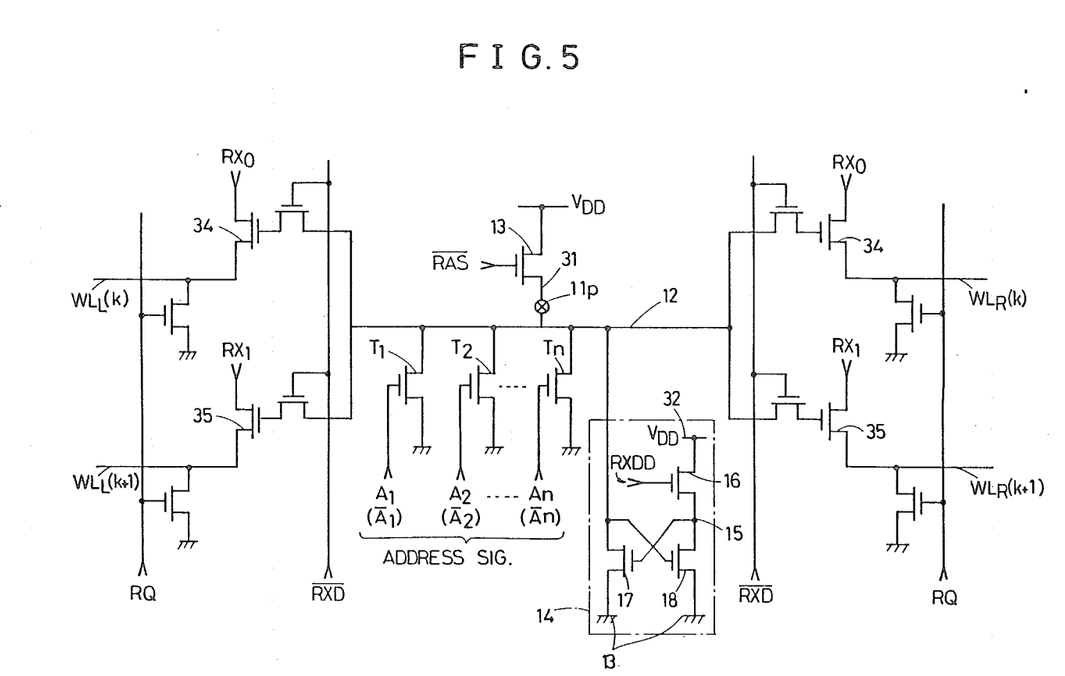
FIG. 5 is a circuit diagram of a normal row decoder circuit provided in an embodiment of the present invention.
Figure 6:
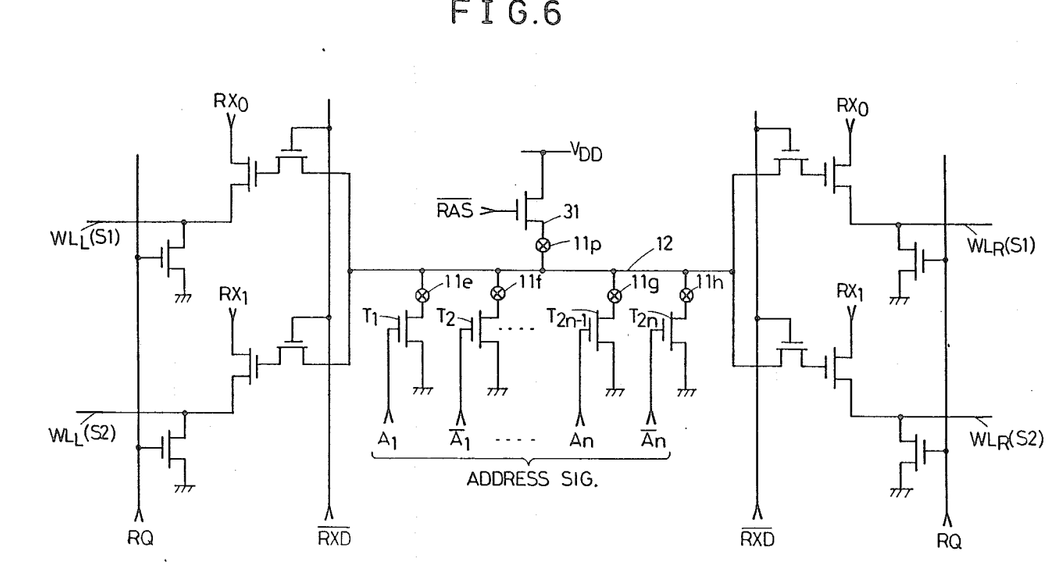
FIG. 6 is a circuit diagram of a spare row decoder circuit provided in an embodiment of the present invention.

FIG. 5 is a circuit diagram showing a normal decoder circuit provided in an embodiment of the present invention and FIG. 6 is a circuit diagram showing a spare decoder circuit provided in an embodiment of the present invention. The decoder circuits shown in FIGS. 5 and 6 correspond to the decoder circuits shown in FIGS. 3 and 4, respectively. Accordingly, the same or like portions in FIGS. 5 and 6 are denoted by the same reference characters as in FIGS. 3 and 4.

Referring to FIG. 5, in the normal row decoder circuit, a link element 11p which can be melted by a laser beam is connected in series with a transistor 13 for precharging an output line 12. More specifically, the link element 11p is inserted in a precharge bus 31 which connects the transistor 13 and the output line 12. In addition to transistors $T_1$ to $T_n$ for discharge of the output line 12, to which address signals are applied through the gates thereof, a clamp circuit 14 is provided so that the output line 12 is maintained at a low level till a precharge signal is applied after decoding of the input address signal. This clamp circuit 14 comprises three MOS transistors 16, 17 and 18. The drain of the transistor 16 is connected to a power supply line 32 and to the gate thereof, an RXDD signal which is an inverted and delayed signal of an $\overline{RXD}$ signal is applied. The drain of the transistor 17 is connected to the output line 12 and the gate thereof is connected to a source terminal 15 of the transistor 16. The source of the transistor 17 is connected to the ground 33. The drain of the transistor 18 is connected to the source terminal 15 of the transistor 16, the gate thereof is connected to the output line 12 and the source thereof is connected to the ground 33. Needless to say, in this circuit, link elements are not required for each word line, as is different from a conventional row decoder circuit.

With such structure as described above, a normal row decoder in an embodiment of the present invention makes it possible to decrease the distribution density of link elements as compared with a conventional row decoder circuit. More specifically, in the structure of a normal row decoder, only one link element is provided in a precharge bus instead of the link elements provided for each word line and, as a result, the distribution density of link elements can be extremely decreased as compared with a conventional device. Accordingly, the distance between the respective link elements can be made large.

FIG. 6 shows a spare row decoder circuit to be employed in an embodiment of the present invention. The spare row decoder circuit shown in FIG. 6 has a structure in which a link element 11p is provided in a precharge bus 31 instead of the link elements 11a to 11d provided for each word line in the conventional spare row decoder circuit shown in FIG. 4. Another structure is the same as conventional spare row decoder.

For the purpose of facilitating the understanding of the operation of the circuits shown in FIGS. 5 and 6 to be described below, a concrete circuit structure of the delay and inversion circuits 8 and 9 (see FIGS. 1) for providing the $\overline{RXD}$ and RXDD signals will be specifically described with reference to FIGS. 8 and 9, respectively.

Figure 8:
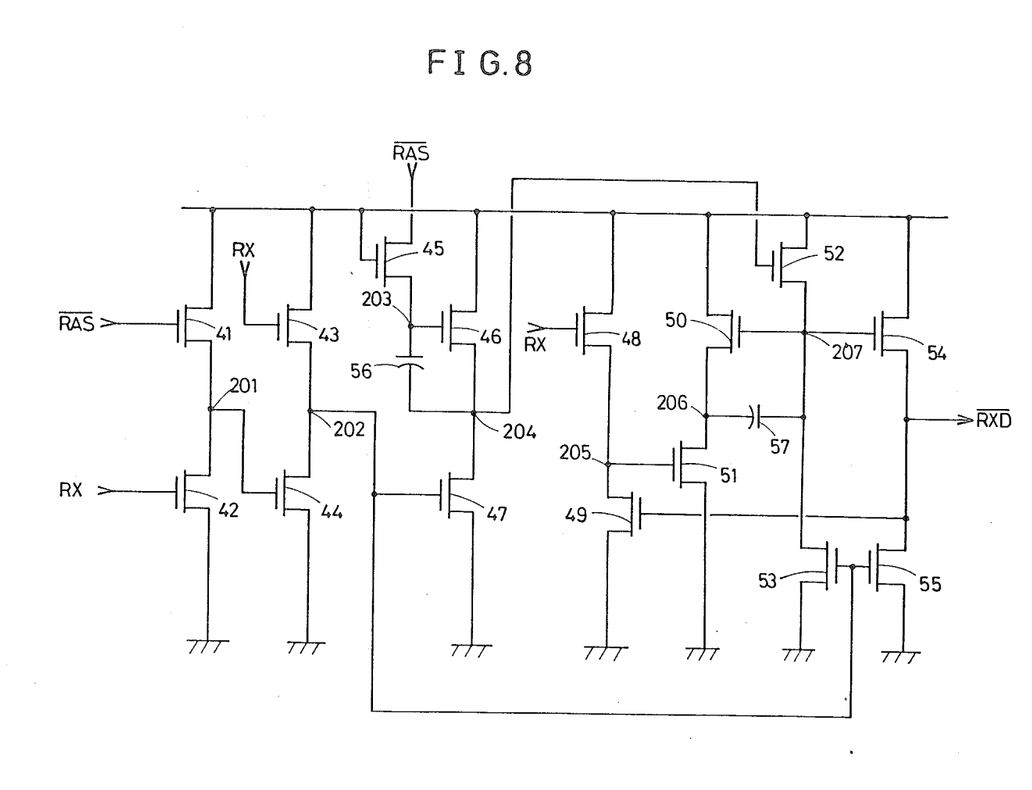
FIG. 8 is a circuit diagram showing an example of a circuit structure of a delay and inversion circuit 8 as shown as FIG. 1.

FIG. 8 is a circuit diagram showing a concrete structure of the delay and inversion circuit 8 (see FIG. 1). This delay and inversion circuit receives an $\overline{RAS}$ signal as a precharge signal and an RX signal as a word line driver signal and provides an $\overline{RXD}$ signal which falls with a delay at the rise of the RX signal.

Referring to FIG. 8, the reference characters 41 to 55 denote MOS transistors and the reference characters 56 and 57 denote capacitors. The reference characters 201 to 207 denote node numbers. Generally, in a circuit of this kind, the ON-resistance in the transistor 46 is set to a value ten times or more than ten times that of the transistor 47 and the ON-resistance of the transistor 50 is set to a value ten times of more than ten times that of the transistor 51.

Now, let us assume that the $\overline{RAS}$ signal to be applied to the gate of the transistor 41 and to the drain of the transistor 45 is at the high level, that the RX signal to be applied to the gates of the transistors 42, 43 and 48 is at the low level, and that the $\overline{RXD}$ signal as an output signal is at the high level. After that, when the $\overline{RAS}$ signal attains the low level, the transistor 41 is turned into the OFF-state, while the high level in the node 201 and the low level in the node 202 are not changed, the transistor 55 being maintained in the OFF-state. Accordingly, the $\overline{RXD}$ signal is maintained at the high level.

Then, when the RX signal attains the high level, the transistors 42 and 43 are turned into the ON-state and the transistor 44 is turned into the OFF-state. As a result, the node 202 attains the high level and the transistors 53 and 55 are turned into the ON-state. At the same time, the potential in the node 207 is discharged and the transistor 54 is turned into the OFF-state. Accordingly, the $\overline{RXD}$ signal attains the low level.

In other words, the delay time after the high level of the RX signal till the low level of the $\overline{RXD}$ signal is determined dependently on the transistor parameters as well as on the stray capacitance of each node.

On the other hand, when the $\overline{RAS}$ signal attains the high level, the RX signal attains simultaneously the low level and, as a result, the transistors 41 and 44 are turned into the ON-state and the transistors 42 and 43 are turned into the OFF-state and the node 202 attains the low level. In this case, however, the node 203 is charged at the high level before the node 202 attains the low level. Accordingly, in this case, the transistors 46 and 47 are both in the ON-state, while the potential in the node 204 is at the low level almost equal to the ground level.

Subsequently, when the node 202 attains the low level and the transistor 47 is turned into the OFF-state, the potential in the node 204 increases. This increase of potential is transmitted to the node 203 through the capacitor 56 and, by a so-called bootstrap effect causing the potential of the node 203 to be higher than $V_{DD} + V_T$ ($V_T$ being threshold voltage of the transistor), the node 204 attains a level as high as $V_{DD}$. Then, the transistor 52 is turned into the ON-state so that the node 207 is charged. At this time, the transistor 50 is in the ON-state and the transistor 51 is also in the ON-state since the node 205 is at the high level, while the potential of the node 206 is a low level almost equal to the ground level since the ON-resistance of the transistor 0 is set to a value ten times of more than ten times that of the transistor 51. Accordingly, the capacitor 57 is charged to the ground level. When the node 207 reaches a fairly high level, the $\overline{\text{RXD}}$ signal tends to be at the high level. At this time, the transistor 49 is turned into the ON-state and voltage in the node 205 is discharged. As a result, the transistor 51 is turned into the OFF-state and the node 206 attains the high level. This increase of potential is transmitted through the capacitor 57 so that the potential of node 207 is higher than $V_{DD} + V_T$ and the $\overline{\text{RXD}}$ signal is at a level as high as $V_{DD}$.

Figure 9:
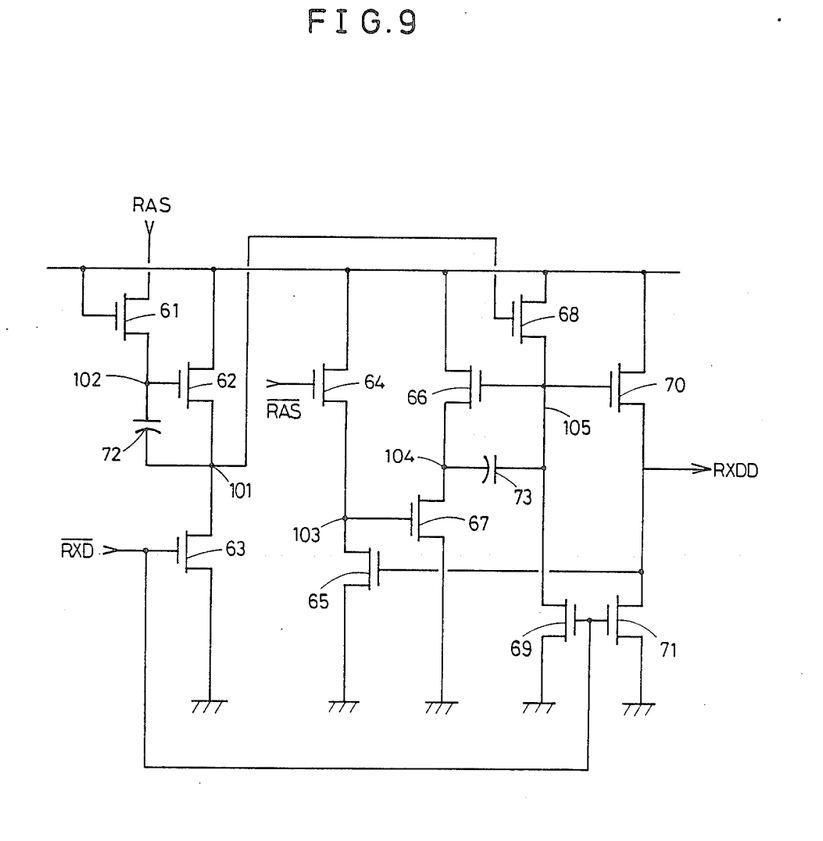
FIG. 9 is a diagram showing an example of a circuit structure of a delay and inversion circuit 9 as shown as FIG. 1.

FIG. 9 shows an example of a concrete circuit structure of the delay and inversion circuit 9 (see FIG. 1). This delay and inversion circuit 9 provides an RXDD signal which rises with a delay after the rise of the $\overline{\text{RXD}}$ signal.

Referring to FIG. 9, the reference characters 61 to 71 denote MOS transistors and the reference characters 72 and 73 denote capacitors. The RAS signal is an inverted signal of the $\overline{\text{RAS}}$ signal. The reference characters 101 to 105 denote the numbers of the nodes. Usually, the ON-resistance of the transistor 62 is selected to be a value ten times or more than ten times that of the transistor 63 and the ON-resistance of the transistor 66 is selected to be a value ten times or more than ten times that of the transistor 67. In a period in which the $\overline{\text{RAS}}$ signal is at the high level, since the RAS signal is at the low level and the $\overline{\text{RXD}}$ signal is at the high level, the transistor 71 is in the ON-state, the transistor 70 is in the OFF-state and the RXDD signal is at the low level.

When the $\overline{\text{RAS}}$ signal attains the low level and the RAS signal attains the high level, the transistor 62 is turned into the ON-state and the transistor 63 is still in the ON-state. Since the ON-resistance of the transistor 62 is set to a value ten times or more than ten times that of the transistor 63, the potential of the node 101 is at the low level almost equal to the ground level. Consequently, the transistor 68 is never turned into the ON-state and the RXDD signal remains at the low level.

After that, when the $\overline{\text{RXD}}$ signal attains the low level, the high level of $V_{DD}$ is applied to the node 101 due to a bootstrap effect in the same manner as described above in FIG. 8 and the node 105 is charged. Subsequently, due to such a bootstrap effect as described above, the high level of $V_{DD}$ is applied to the RXDD signal. The delay time after the low level of the $\overline{\text{RXD}}$ signal till the high level of the RXDD signal is also determined by the transistor parameters and the stray capacitance of each node.

Thus, the $\overline{\text{RXD}}$ and the RXDD signal are provided.

Figure 7:
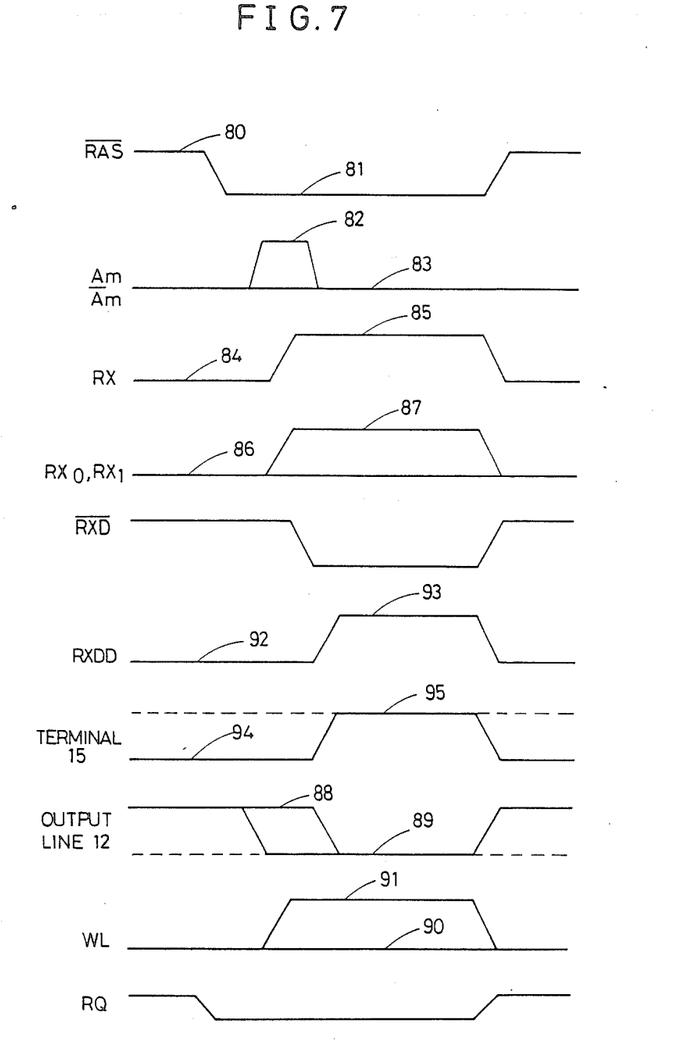
FIG. 7 is a waveform diagram for explaining the operation of the row decoder circuits shown in FIGS. 5 and 6.

Now, the operation of the circuits shown in FIGS. 5 and 6 will be described with reference to the waveform diagram of FIG. 7. In FIG. 7, the broken lines represent waveforms of the operation after the link element 11p of a normal row decoder circuit associated with a faulty memory cell has been melted.

Referring mainly to FIGS. 5 and 7, the operation in the normal state of the memory cells selected by a word line connected to a normal row decoder circuit will be first described.

In a period where the $\overline{\text{RAS}}$ signal is at the high level 80, the row decoder circuits are precharged. After the $\overline{\text{RAS}}$ signal attains the low level 81, the input address signals $A_m$ and $\overline{A}_m$ being 1 to n) are selectively at the high level 82. In consequence, a specified row decoder circuit out of the normal row decoder circuits is selected. The output line 12 of the selected row decoder circuit is maintained at the selective level 88. The output lines 12 of all the other row decoder circuits excluding the selected row decoder circuit are discharged and are brought to the non-selective level 89. In the selected row decoder circuit, the output line 12 maintains the selective level 88 and the sub-decoding signals $RX_0$ and $RX_1$ attain the low level 86 or the high level 87 according to the low level 84 or the high level 85 of the word line drive signal RX, so that the word lines WL to the left and to the right of the row decoder circuit are driven to be brought to the non-selective level 90 or the selective level 91. The $\overline{\text{RXD}}$ signal is a signal for separating the row decoder circuit from the word lines WL. The RQ signal is a signal for clamping the non-selective word lines to the ground.

Now, assuming that a fault is detected in a memory cell selected by a word line of a normal row decoder circuit as shown in FIG. 5. In this case, the link element 11p is melted by a laser beam so that the $\overline{\text{RAS}}$ signal may not be applied to the output line 12 through the precharge bus 31. Consequently, the output line 12 of the row decoder circuit connected with the faulty memory cell is maintained at the non-selective level 89 since there is no charge bus. As a result, the word line is brought to the non-selective level 90 without fail. When the RXDD signal is changed from the low level 92 to the high level 93, the transistor 16 forming the clamp circuit 14 is turned into the ON-state and the terminal 15 is maintained at the high level 95. As a result, the transistor 17 is turned into the ON-state and the output line 12 of the row decoder circuit is always maintained at the non-selective level 89. Accordingly, when the input address signals $A_m$ and $\overline{A}_m$ of the row decoder circuit are at the low level 83, the sub-decoding signals $RX_0$ and $RX_1$ are brought to the high level 87, whereby the potential of the output line 12 can be prevented from increasing by the capacitor coupling of the gate capacitors of the transistors 34 and 35.

On the other hand, also in a row decoder circuit connected with normal memory cells, the terminal 15 of the clamp circuit 14 is brought to the high level 95 from the low level 94 by the RXDD signal after decoding of the input address signals $A_m$ and $\overline{A}_m$. As a result, the output line 12 of the row decoder circuit is brought to the low level 89 to be in the non-selective state. However, if precharging is applied by the $\overline{\text{RAS}}$ signal, the voltage of the terminal 15 is discharged through the transistor 18. Accordingly, the transistor 17 is turned into the OFF-state and the output line is maintained at the high level 88 so as to establish a state in which the input address signals can be decoded.

In this case, the RXDD signal is provided by applying inversion and delay to the $\overline{\text{RXD}}$ signal, as described above. More specifically, since the RXDD signal is provided after the row decoder circuit has been completely separated from the word line, misdecoding of the input address signals can never occur.

Substitution of the spare row decoder circuit shown in FIG. 7 for the normal row decoder circuit connected with a faulty memory cell is performed in the same manner as in the previously described conventional circuit and, therefore, the description thereof is omitted.

Although in the foregoing embodiment, an example of a row decoder circuit was described, it goes without saying that the present invention can also be applied to the column decoder circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory cell comprising:
   a plurality of memory cells for storing binary signals,
   a plurality of decoders connected to said memory cells for selecting said connected memory cells, said decoders including normal decoders and a spare decoder,
   precharge signal providing means connected respectively to said plurality of decoders for providing a precharge signal to each of said decoders, whereby said decoders are brought into a selective state,
   address signal providing means connected respectively to said decoders by a plurality of address signal lines for providing address signals for selecting specifically said decoders,
   link elements inserted between said respective decoders and said respective precharge signal providing means and interposed in said plurality of address signal lines for connecting said spare decoders and said address signal providing means, said link elements being caused to be melted so that an electrically insulated state is established to bring an associated circuit line into an electrically disconnected state.

2. A semiconductor memory device in accordance with claim 1, wherein
   said decoders comprise output lines,
   said precharge signal providing means are connected to said output lines through one of said link elements, and
   said plurality of address signal lines included in said address signal providing means are connected to said output lines.

3. A semiconductor memory device in accordance with claim 2, further comprising:
   latching means connected to said output lines of said decoders for maintaining the output lines of the decoders not selected to a prescribed potential.

4. A semiconductor memory device in accordance with claim 3, wherein
   said latching means is a flip-flop circuit.

5. A semiconductor memory device in accordance with claim 1, wherein
   said semiconductor memory device is structured by field-effect devices.

6. A semiconductor memory device in accordance with claim 5, wherein
   said link elements can be melted by a laser beam.

* * * * *